United States Patent [19]
Fluegge

[11] Patent Number: 5,745,372
[45] Date of Patent: Apr. 28, 1998

[54] APPARATUS AND METHOD FOR ROUTING SIGNALS IN A FIELD PROGRAMMABLE GATE ARRAY INTEGRATED CIRCUIT

[75] Inventor: Michael W. Fluegge, Colorado Springs, Colo.

[73] Assignee: Hewlett-Packard Company, Palo Alto, Calif.

[21] Appl. No.: 434,836

[22] Filed: May 4, 1995

[51] Int. Cl.[6] .................................................. G06F 17/50
[52] U.S. Cl. ................................... 364/489; 364/489
[58] Field of Search ............................. 364/490-491, 364/488, 489; 395/500; 326/41

[56] References Cited

U.S. PATENT DOCUMENTS

| | | | |
|---|---|---|---|
| 4,613,941 | 9/1986 | Smith et al. | 364/490 |
| 5,237,514 | 8/1993 | Curtin | 364/490 |
| 5,317,698 | 5/1994 | Chan | 345/325 |
| 5,448,496 | 9/1995 | Butt et al. | 364/489 |
| 5,452,231 | 9/1995 | Butts et al. | 364/489 |
| 5,457,410 | 10/1995 | Ting | 326/41 |
| 5,519,629 | 5/1996 | Snider | 364/490 |
| 5,557,531 | 9/1996 | Koford | 364/490 |
| 5,557,533 | 9/1996 | Koford et al. | 364/491 |

Primary Examiner—Vincent N. Trans

[57] ABSTRACT

A system for connecting signal wires between circuitry of a Field Programmable Gate Array (FPGA). When a connection cannot be made, the system attempts to move the circuitry to a different location in order to resolve the congestion. The system first attempts to move the circuitry to a different location at the same allocation level within the FPGA, and if the system is unsuccessful, it will then attempt to move all the circuitry at the allocation level of the circuitry causing the congestion to a new location within a next higher allocation level. This will continue until the top level is reached. When attempting to move the circuitry, the system first tries to place the circuitry in the closest area on one side or the other of the circuitry and then moves alternatingly outward away from the circuitry trying to find a suitable location.

16 Claims, 12 Drawing Sheets

5,745,372

APPARATUS AND METHOD FOR ROUTING SIGNALS IN A FIELD PROGRAMMABLE GATE ARRAY INTEGRATED CIRCUIT

FIELD OF THE INVENTION

This invention relates to electronic circuits and more particularly to Field Programmable Gate Arrays (FPGAs). Even more particularly, the invention relates to placement and routing of circuits within an FPGA.

BACKGROUND OF THE INVENTION

A field programmable gate array (FPGA) is an electronic integrated circuit device that can be programmed to create a logic circuit. That is, the FPGA contains a large number of general purpose logic circuits, and by programming information into the FPGA, the general purpose logic circuits can be connected to create a logic circuit to accomplish a specific purpose.

An FPGA is comprised of a large number of logic blocks, each called a programmable atomic logic element, or PALE. Each PALE has a large number of signal inputs, and one signal output. Through programming, inputs can be selected and the logic gates within the PALE arranged to perform a complex logic operation having a single output. Further, the FPGA contains connecting signal wires between the PALEs and these connecting signal wires can be programmed to carry signals that are input to the chip from other circuits or programmed to carry signals that are output by an individual PALE and input by one or more other PALEs.

PALEs are typically organized into several different groupings, for example, in the present invention as described below with respect to FIG. 2, four PALEs are contained in a LEAF, sixteen LEAFs are contained in a BLOCK, sixteen BLOCKs are contained in a SECTOR, and four SECTORs are contained in the FPGA CHIP. Connecting signal wires exist to connect circuits at each of these levels. Thus, part of the programming of an FPGA is to direct the output signals from PALEs onto the various levels of connecting signal wires in order to connect the output of a PALE to a desired input of one or more other PALEs. When a signal must travel a long distance within an FPGA, it must traverse through several of the different levels of connecting signal wires. For example, in the present invention, for an output to go from one sector to another, it must travel on a level zero wire as it exits the PALE, traverse to a level one wire to connect across the LEAF, traverse to a level two wire to connect across the BLOCK, traverse to a level three wire to connect across the SECTOR, and then traverse to a level four wire to connect between the SECTORs, in order to connect to the target SECTOR. To improve this process, the present invention provides hyperlinks which allow the output of a PALE to go directly to the desired level in order for it to connect across the desired distance. For example, hyperlinks exist for the output of a PALE to connect directly to a level four wire, or to connect directly to a level three wire, etc.

Naturally, the number of wires available for connecting signals is limited within an FPGA. As a result, when attempting to place circuit programming within an FPGA, the output of a PALE may not be able to connect to a wire necessary to take it to its destination, usually because the connecting wire is already allocated for use by another PALE. When this occurs, the routing is said to be congested. When congestion occurs, the system must be directed to program the circuitry for a PALE at a different location, called a tile. Since all tile locations have identical logic circuitry available to be programmed, any tile location on the CHIP can be programmed to perform the desired function of the circuitry in a PALE. Thus, when congestion occurs, the programming for circuitry of a PALE can be moved to a new tile location, provided that such a new tile will not also cause congestion.

There is need in the art of programming field programmable gate arrays to detect when congestion occurs upon programming the FPGA. There is further need in the art to rearrange the circuitry to avoid such congestion. Still another need in the art is to detect congestion when programming when using hyperlinks and to rearrange these circuitry to avoid such congestion. The present invention meets these and other needs in the art.

SUMMARY OF THE INVENTION

It is an aspect of the present invention to provide a method and apparatus for routing signals between circuits within a Field Programmable Gate Array (FPGA) electronic integrated circuit.

It is another aspect of the invention to provide a method for routing hyperlink signals between circuits within an FPGA.

Another aspect of the invention is to detect congestion of signals being routed wherein a signal cannot be routed due to the congestion.

A further aspect of the invention is to provide a method for rearranging circuits within the FPGA to allow routing of the signals between circuits after such congestion is detected.

The above and other aspects of the invention are accomplished in a system that allocates connecting signal wires to the output of the PALE circuitry at each logic tile location within the FPGA. Since several hyperlinks are available for the output of each location, the system checks each of these to determine whether an output connecting signal wire is available. If an output connecting signal wire is not available, congestion has occurred, and the system attempts to move the circuitry of the PALE to a different logic tile location in order to resolve the congestion.

When attempting to move the logic, the system first attempts to move the logic for the PALE to a different logic tile location within a LEAF, and if the system is unsuccessful, it will then attempt to move all the circuitry of the LEAF to a new LEAF within a BLOCK. If this is unsuccessful, the system will attempt to move all the circuitry of the entire BLOCK to a new location within a SECTOR, and finally if unsuccessful, the system will attempt to move the circuitry for the SECTOR to a new SECTOR location within the CHIP.

When attempting to move the logic, the system first tries to place the logic in the closest tile on one side or the other of the tile causing the congestion. The system first attempts to place the logic in a tile nearest the tile causing the congestion but also nearest to the edge of the particular routing aggregate, that is, either a LEAF, BLOCK, SECTOR, or CHIP. If that attempt fails, the system will then attempt to place the logic on the nearest tile on the other side of the tile causing the congestion. The system will then alternate back and forth so long as there are tiles on both sides of the tile causing the congestion, however, when there are no longer tiles on one side the system will continue to allocate tiles on the other side until all tiles have been attempted.

BRIEF DESCRIPTION OF THE DRAWINGS

The above and other objects, features, and advantages of the invention will be better understood by reading the

Figure 1:
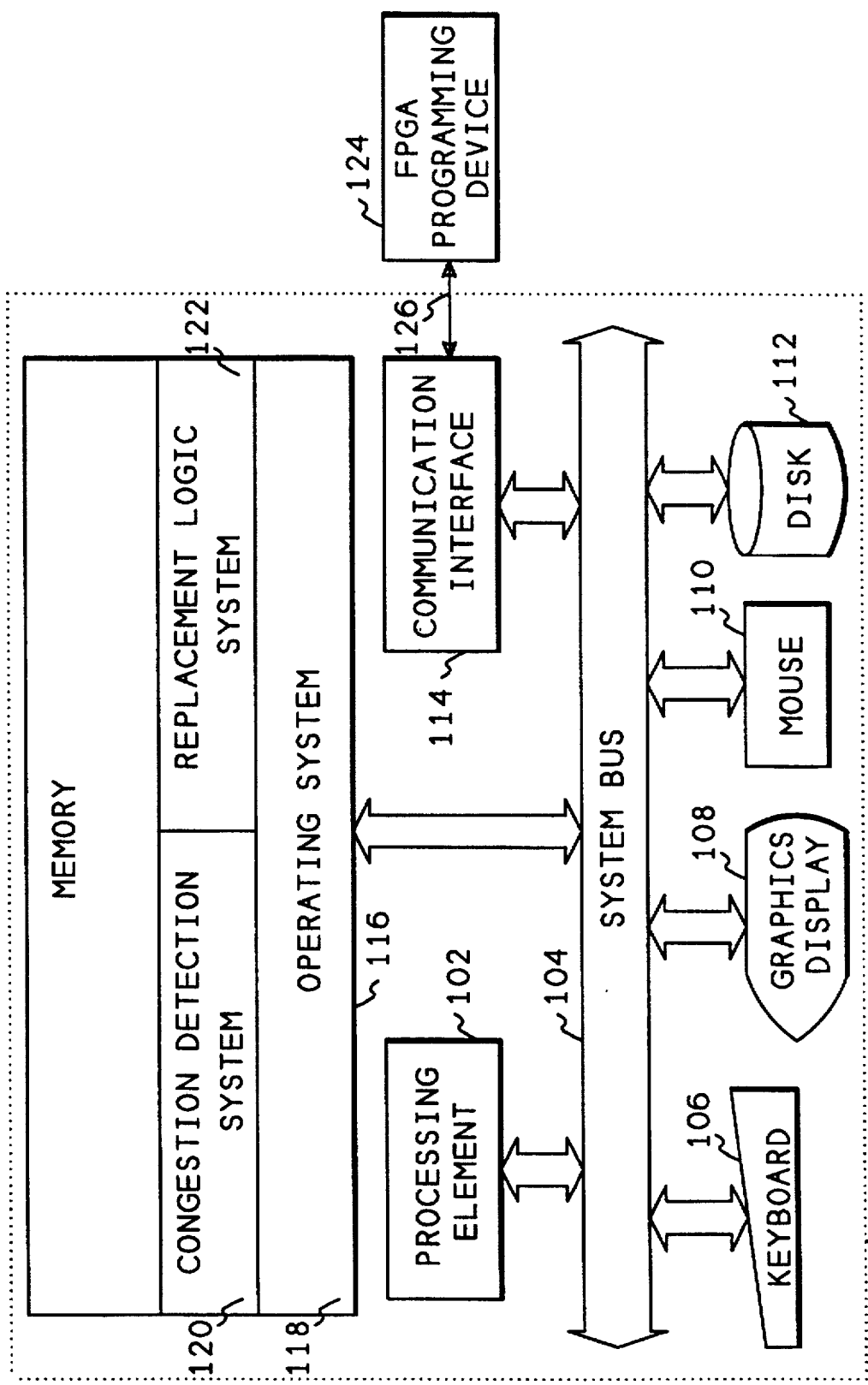
Figure 2:
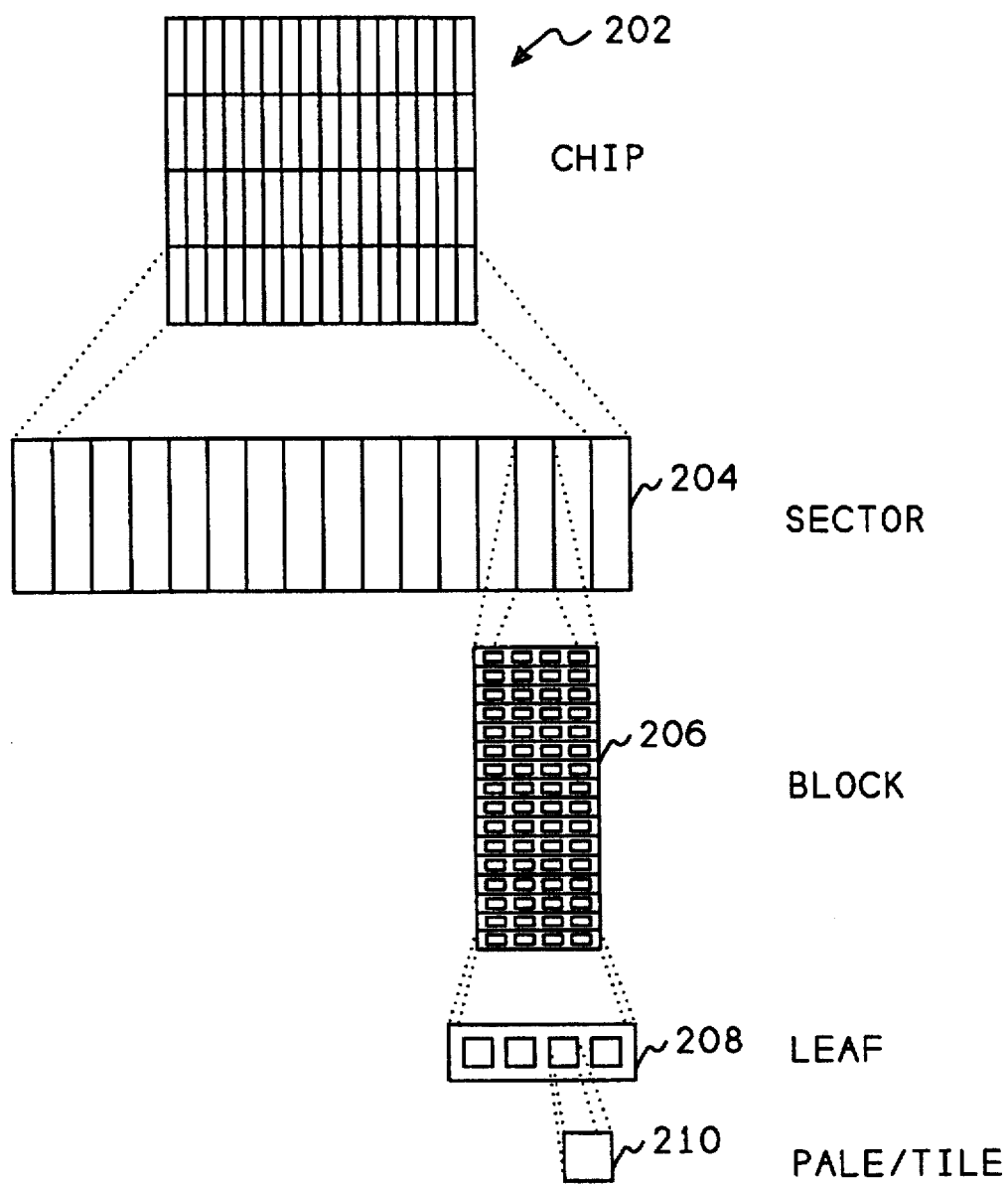
Figure 3:
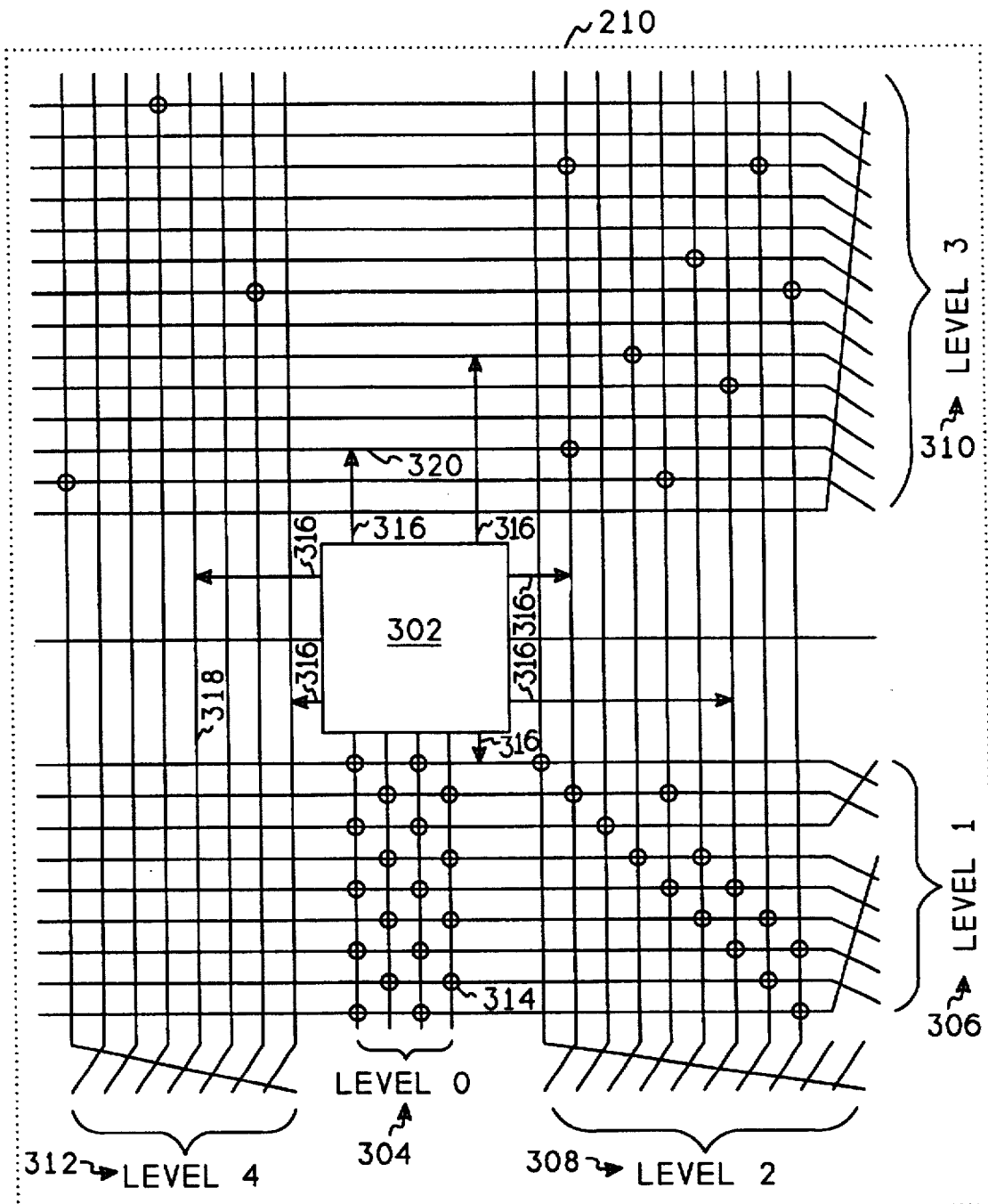
Figure 4:
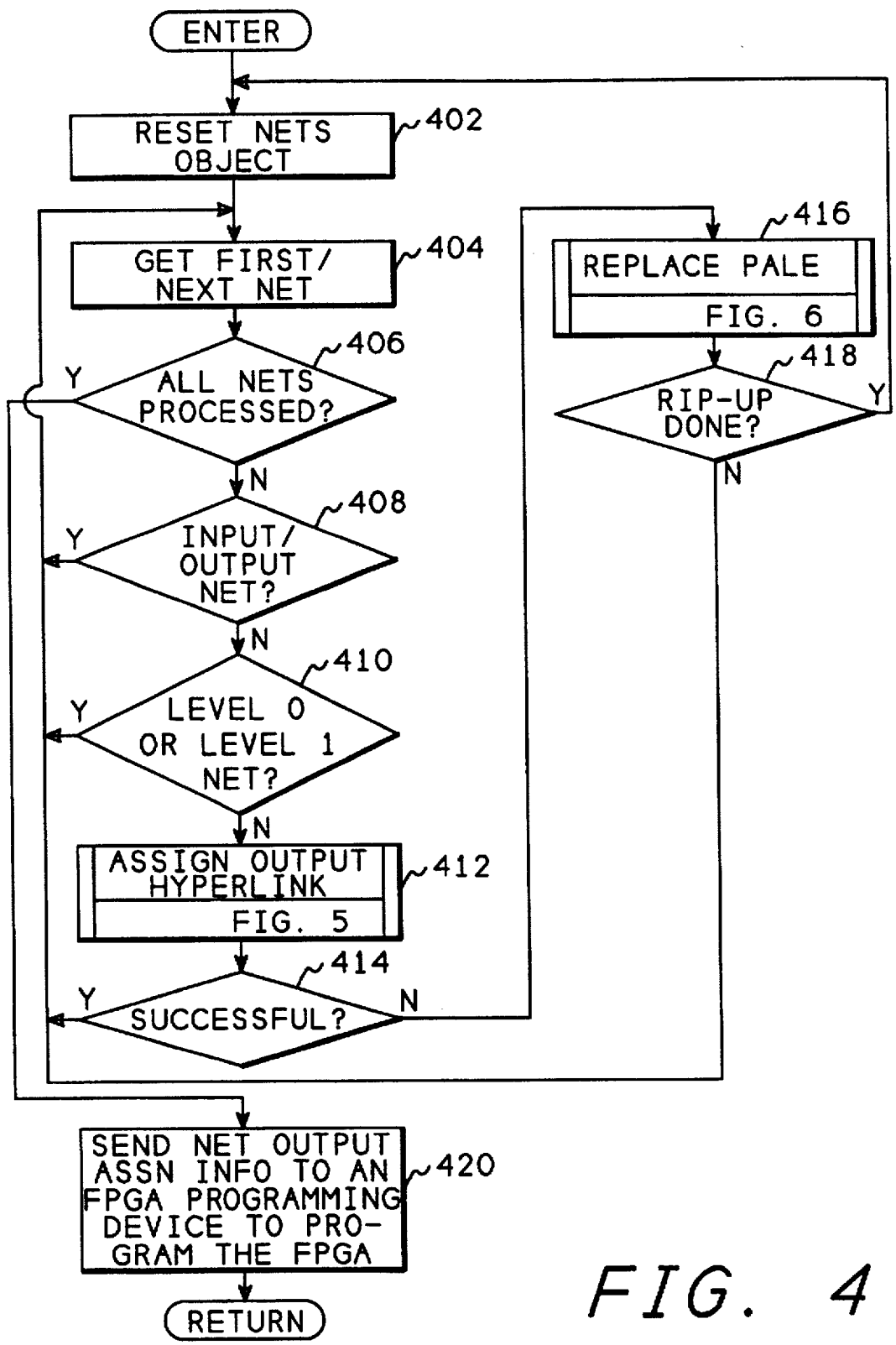
Figure 5:
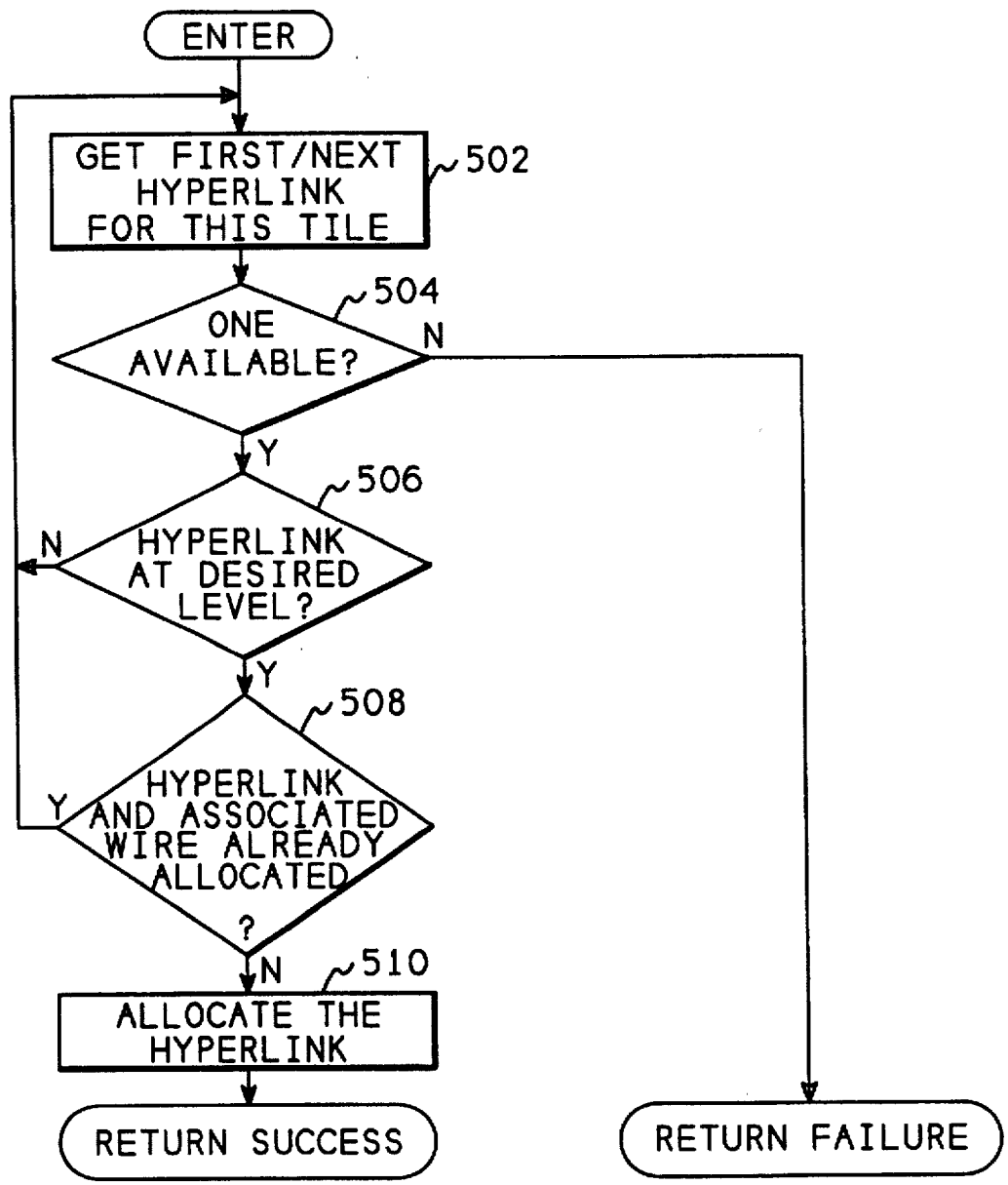

3 following more particular description of the invention, presented in conjunction with the following drawings, wherein:

FIG. 1 shows a block diagram of a computer system incorporating the present invention;

FIG. 2 shows a block diagram of a Field Programmable Gate Array for which the present invention will route signals;

FIG. 3 shows a block diagram of a circuit within a tile of a Field Programmable Gate Array;

FIGS. 4 and 5 show a flowchart of the hyperlink allocation and congestion detection system; and FIGS. 6–12 show a flowchart of the replacement logic system.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Some of the terms used in this application are:

Tile, or logic tile—a location within an FPGA that contains circuitry to be programmed in order to perform a desired function.

PALE—the programmed circuitry within a Tile. A PALE can be moved to a new Tile by programming the new Tile in the same way the old Tile was programmed. A PALE is also the lowest level circuit within an FPGA.

LEAF—a group of four Tiles.

BLOCK—a group of 16 LEAFs.

SECTOR—a group of 16 BLOCKs.

CHIP, or FPGA, the entire integrated circuit, which is also a group of four SECTORs.

Routing Aggregate—A group of circuitry that will be moved together when exchanging circuitry to avoid congestion. A routing aggregate may be a tile, a LEAF, a BLOCK, or a SECTOR.

Level, or wire level—a group of connecting signal wires that connect between a routing aggregate. Level 0 wires are the inputs and outputs of the PALE logic circuitry within a tile. Level 1 wires connect between tiles. Level 2 wires connect between LEAFs. Level 3 wires connect between BLOCKs, and Level 4 wires connect between SECTORs.

Connecting Signal, or Connecting Signal Wire—the combination of wires at various levels to connect a net.

Net—a definition, usually stored as a record within a file, of a connection between two or more PALEs.

FIG. 1 shows a block diagram of a computer system incorporating the present invention. Referring now to FIG. 1, a computer system 100 contains a processing element 102 which communicates to other elements of the computer system 100 over a system bus 104. A keyboard 106 and a mouse pointer device 110 provide input to the computer system 100 while a graphics display 108 provides output from the computer system 100. A disk 112 stores the software and data of the present invention.

A memory 116 contains an operating system 118, and also contains the congestion detection system 120 and the replacement logic system 122 of the present invention. A communications interface 114 allows the computer system 100 to communicate over a bus 126 to a field programmable gate array programming device 124. The FPGA programming device 124 programs an FPGA by inserting programming information into the FPGA Chip.

In the system of the present invention, the congestion detection system 120 reads a net list, typically from the disk 112, wherein the net list defines connections between PALEs. The initial assignment of PALE logic to tile locations may be done by a sophisticated program run prior to this program, the assignment may be done manually, or it may be done in any arbitrary manner. For each net, if a connection signal wire is available for routing the output of a PALE to its destination, the system allocates the wire, reads another net from the net list, allocates another connection signal wire, and so on. When the net for a PALE output cannot be routed through a connection wire, the congestion detection system calls the replacement logic system 122 to attempt to move the logic for the PALE to a new tile location.

Once all the logic for all PALEs have been routed, the system sends this routing information over the communications interface 114, over the bus 126, and to the FPGA programming device to program the logic into a field programmable gate array.

FIG. 2 shows a block diagram of the layout for a field programmable gate array for which the present invention will route signals. This layout shows only the relationship between the route-aggregates within the FPGA, and does not show the particular circuitry of the FPGA, since the particular circuitry is unimportant to the present invention.

Referring now to FIG. 2, as discussed above, FPGAs are organized into PALEs. A PALE is the minimum amount of logic circuit that can be programmed. A PALE has many inputs but only a single output, thus a PALE can be programmed to represent a single logic equation. A location on the CHIP that contains the logic for a PALE is called a logic tile, tile location, or simply a tile.

PALE 210 contains logic which can be placed into one of four tiles contained within a LEAF 208. LEAF 208 is one of sixteen LEAFs contained within BLOCK 206. BLOCK 206 is one of sixteen BLOCKs contained within SECTOR 204, and SECTOR 204 is one of four SECTORs contained within the CHIP 202. Thus it can be seen that a logic tile contains logic for a single PALE, and there are 4096 logic tiles within an FPGA CHIP comprising four tiles per LEAF, sixteen LEAFs per BLOCK, sixteen BLOCKs per SECTOR, and four SECTORs in a field programmable gate array CHIP.

FIG. 3 shows a block diagram of a PALE within a logic tile of a field programmable gate array. Referring now to FIG. 3, logic tile/PALE 210 is shown having logic circuitry 302 which can have many inputs and a single output. Those skilled in the art will recognize, however, that the invention is not limited to circuits having a single output, since the invention is applicable regardless of the number of inputs or outputs.

Level zero wires 304 connect to the logic circuitry 302 and allow signals to be connected into or out of the logic circuitry 302. Level zero wires are contained completely within a single logic tile but can connect to level one wires 306 through connections 314, each represented in FIG. 3 by a circle surrounding the crossing point of two wires. Level one wires 306 connect between logic tiles within a single LEAF. Level one wires 306 can also connect to level two wires 308 to allow signals to connect from one LEAF to another within a BLOCK. Thus, level two wires 308 span all sixteen LEAFs within a single BLOCK. In addition, level two wires 308 can connect to level three wires 310 to provide for connections between BLOCKs within a SEC- TOR. Thus, level three wires 310 span all sixteen BLOCKs within a single SECTOR. To connect signals between SECTORs, level three wires 310 can connect to level four wires 312 which span across all SECTORs within a CHIP.

Thus, it can be seen that when a signal must go from a PALE circuit in a tile of one LEAF of one BLOCK of one SECTOR to a PALE circuit of a tile within another SECTOR, the signal must traverse through a level zero wire, then to a level one wire, then to a level two wire, then to a level three wire, and then to a level four wire, so that it can span to the other SECTOR. Once the signal reaches the other SECTOR, it must reverse this route from the level four wire in that SECTOR, down to a level three wire, down to a level two wire, then down to a level one wire, and finally down to a level zero wire so that it can enter the logic circuitry 302 in the new location.

The present invention provides hyperlinks 316 that allows the output signal of a PALE within the logic circuit 302 to bypass one of these level traverses. The hyperlinks 316 are shown having arrowheads thereupon. All of the hyperlinks 316 are connected to the single output of the logic circuitry within the block 302, therefore, only one of the hyperlinks would typically be connected to one of the level wires. However, so that the level traversing can be bypassed, there are hyperlinks leading from the logic circuitry 302 to each of the levels of connecting wires. Thus, a hyperlink can directly connect to level four wire 318 or to level three wire 320, etc.

As discussed above, in order to use the system of the present invention and the FPGA, an engineer must program the FPGA by providing a list of signal connections, called nets, that interconnect the various logic PALEs to accomplish a desired circuit. These nets must identify each location to which the output of a PALE must be connected. These nets do not, however, identify any specific logic tile for placement of the circuitry of the PALE. The present invention determines the logic tile locations for each of the PALEs.

Once the list of nets, also called a net list, is provided and stored on the disk 112 (FIG. 1), the congestion detection system 120 reads the list and attempts to allocate wires for the net within a logic tile location. Although not part of the invention, another process may make a first attempt at placing the PALEs within particular logic tiles. Alternatively, this initial placement might be provided manually by the engineer while programming the FPGA.

As discussed above, the congestion detection system 120 (FIG. 1) reads the net list, attempts to place the PALE logic within logic tiles, and attempts to accomplish the connection signal routing as programmed by the engineer. Since the number of signal wires is limited, the congestion detection system 120 must detect whether a wire is available for routing the output of each PALE, and if not, call the replacement logic system 122 (FIG. 1) to attempt to move the PALE logic circuitry to another tile location, in order to remove the congestion.

FIGS. 4 and 5 show a flowchart of the congestion detection system 120 (FIG. 1) of the present invention. Although not part of the invention, additional software might be present to interface to the user of the computer system 100, in order to identify the file containing the net list, and do administrative processing of this file. Once the administrative processing is accomplished, that software calls the present invention at FIG. 4 block 402. Referring now to FIG. 4, after entry, block 402 resets the nets object, which is the object that will contain the net list and all the signal wire routing information once it is established. Resetting this object clears all the connection signal routing information, but not the placement locations for the PALEs within the tiles.

After resetting the nets object, block 404 gets the first or next net from the net list. Block 406 then determines whether all nets have been processed, and if not, transfers to block 408 which determines whether the net is an input or an output net connecting to input or output pins of the CHIP. The present invention is not concerned with the routing of input or output nets, which route connection signals to input or output pins of the FPGA.

If the net is not an input or output net, that is, it is a net identifying a signal connection within the FPGA, block 408 transfers to block 410. Block 410 determines whether the net is for a level zero or level one wire routing. Because of the abundance of level zero and level one wires, the congestion detection system does not need to process nets for these wires. Therefore, if the net is not for a level zero or a level one wire, block 410 transfers to block 412 which calls FIG. 5 to assign the output of the net to a hyperlink. Although the invention is primarily concerned with allocating wires to hyperlinks, it is not so limited, and is applicable to any type of routing.

After returning from FIG. 5, block 414 determines whether the routing was successful and if so, returns to block 404 to get the next net in the list. If the routing assignment by FIG. 5 was not successful, block 414 transfers to block 416 which calls the replacement logic system starting at FIG. 6. After returning from FIG. 6, block 418 determines whether, in performing the replacement of the PALE into a new tile location, an already placed PALE having its output already assigned, had to be moved. If so, then the old tile must be "ripped up", and therefore block 418 transfers back to block 402 which resets the net object and restarts the routing from the beginning. If no "rip up" was necessary, block 418 transfers back to block 404 to get the next net and continue the current routing.

After all nets have been routed, block 406 transfers to block 420 which sends the net output assignment information to the FPGA programming device 124 (FIG. 1) to program the FPGA. After programming the FPGA, block 420 returns to its caller.

FIG. 5 shows a flowchart of the assign output hyperlink function called from block 412 of FIG. 4. Referring now to FIG. 5, after entry, block 502 gets the first, or next, hyperlink for this logic tile location. Block 504 then determines if a hyperlink is available, and if not, returns a failure indication indicating that the hyperlink could not be routed. If a hyperlink is available, block 504 transfers to block 506 which determines whether the hyperlink obtained in block 502 connects to the desired wire level for the net. As discussed above, hyperlinks exist to all wire levels, thus, the hyperlink obtained may be to an incorrect wire level and must be ignored. If this is the case, block 506 transfers back to block 502 to get the next hyperlink.

If the hyperlink is to the desired level, block 506 transfers to block 508 to determine whether the wire to which the hyperlink connects has already been used by some other PALE within the system. If so, block 508 transfers back to block 502 to get another hyperlink. If not, block 508 transfers to block 510 to allocate this hyperlink and its wire for use by this PALE in this logic tile location and returns a success indication to FIG. 4.

This routing continues until either all nets have been routed, or until one of the nets cannot be routed because no unused combination of hyperlink and wire is available. At that point, block 416 calls FIG. 6 and the replacement logic system of the present invention.

Figure 6:
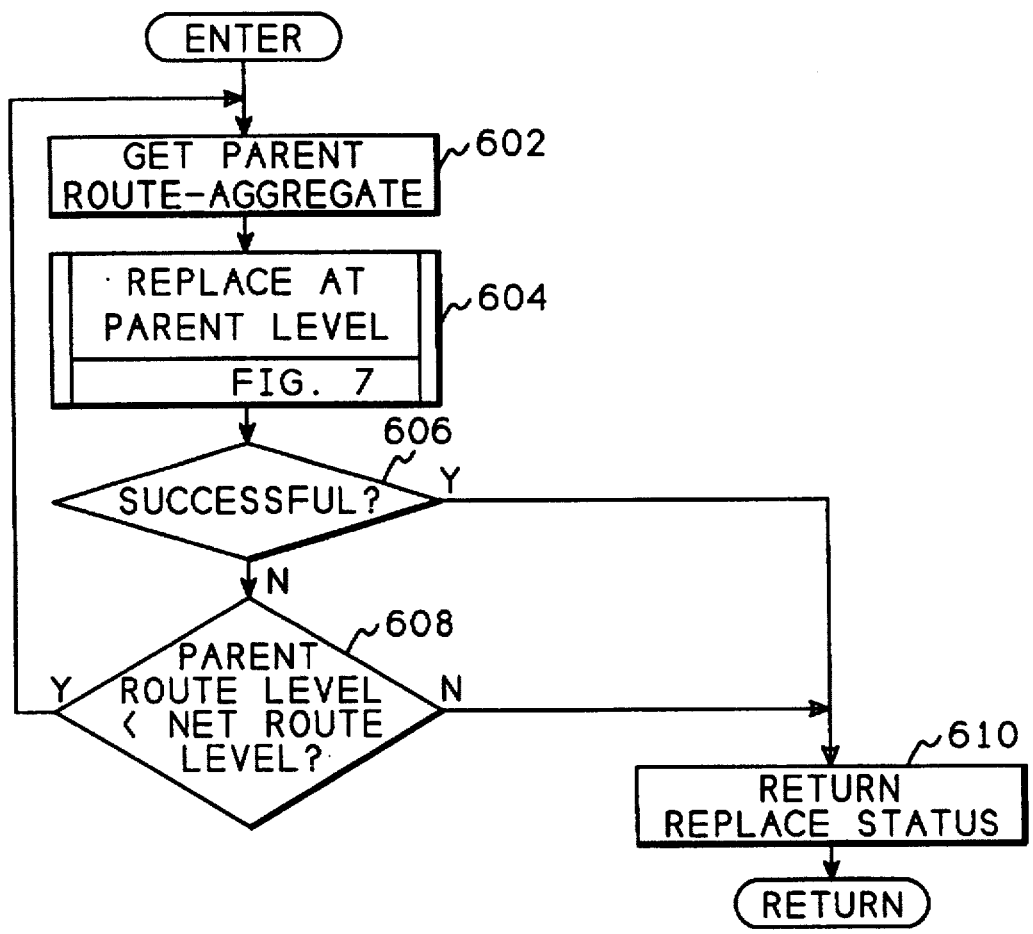

Referring now to FIG. 6, after entry, block 602 gets the parent route-aggregate to the one where congestion has been detected. A route-aggregate is either a logic tile, a LEAF, a BLOCK, or a SECTOR. Typically, the initial route-aggregate will be a tile, so the parent to the route-aggregate will be a LEAF. The parent is obtained since the movement of the route-aggregate that has caused the congestion must initially be within its parent's level. For example, the initial attempt at relocating a PALE located in a tile will be to another tile within the same LEAF. If this fails, the system will then try to place the entire LEAF containing the PALE at a new location within the BLOCK. If this replacement should fail, the system will attempt to place the entire BLOCK at a new location within the SECTOR, and finally the system will attempt to move the entire SECTOR to a new location within the CHIP. The invention is not limited to this type of replacement, and could replace a PALE at a logic tile location with a PALE from any other logic tile location in the entire FPGA.

Figure 7:
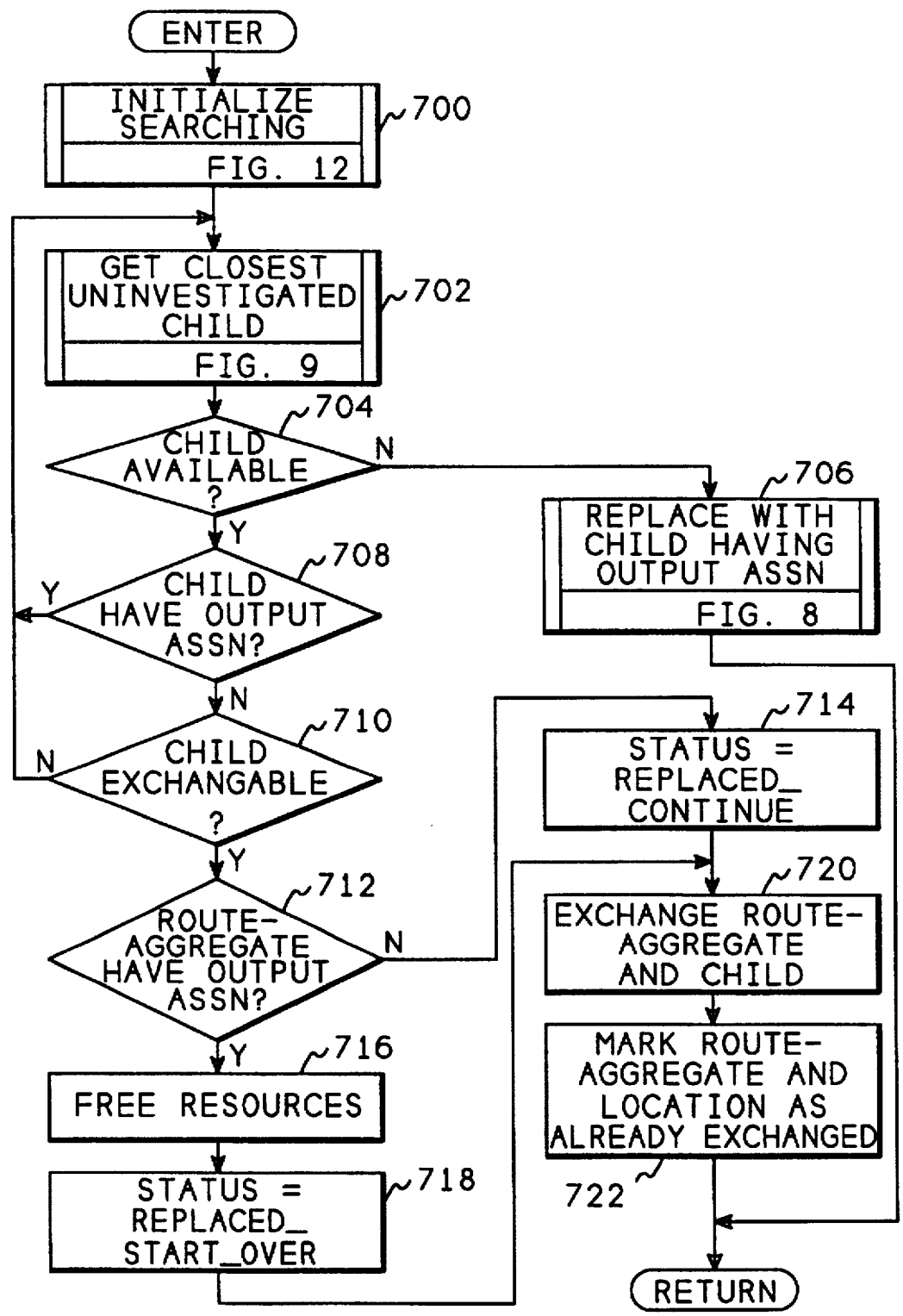

After obtaining the parent to the route-aggregate being replaced, block 604 calls FIG. 7 to replace the route-aggregate from this parent level, as discussed above. After returning from FIG. 7, block 606 determines whether the replacement was successful, and if so, transfers to block 610 to return the successful status.

If the replacement was not successful, block 606 transfers to block 608 which determines whether the parent route level is less than the net route level. That is, for example, if the routing for the net is to a level three wire, and the replacement was unsuccessful, the system will not attempt to replace above level three. This is because a level three routing would be from one BLOCK to another within a SECTOR. If this has failed, nothing can be accomplished by moving an entire SECTOR to another SECTOR location since routing within the new SECTOR would also fail. Therefore, if the parent route level is less than the net route level, block 608 transfers back to block 602 to move up one level in the routing and to then attempt to reroute. If, however, the parent route level is not less than the net route level, additional routing attempts would be unsuccessful so block 608 transfers to block 610 which returns the unsuccessful status to FIG. 4.

FIG. 7 shows a flowchart of the replace at parent level process called from block 604 of FIG. 6. Referring now to FIG. 7, after entry, block 700 calls FIG. 12 to initialize the searching to be performed within the route-aggregate. Thus, if searching is being done within a LEAF, the initialization will identify tiles zero through three of the particular LEAF. If, however, replacement is being attempted within a BLOCK, block 700 will identify the searching as being performed between BLOCK zero and BLOCK 15 of the SECTOR, etc. The initialization also includes defining the starting route-aggregate.

Figure 9:
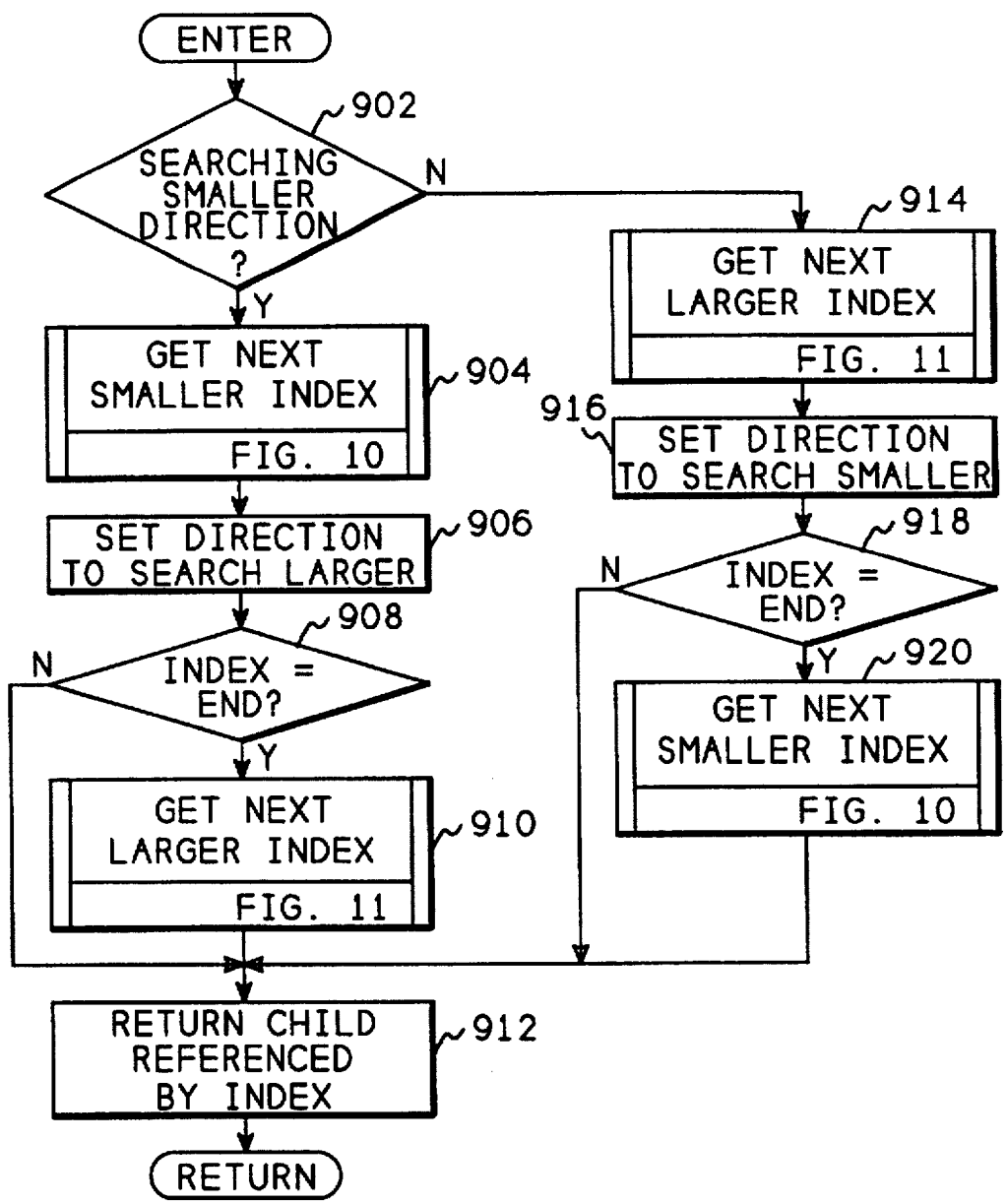

After initializing the searching, block 702 calls FIG. 9 to get the closest uninvestigated child of the route-aggregate. As discussed above, the parent to the route-aggregate that is being replaced has been passed to FIG. 7, thus, the closest uninvestigated child will be a route-aggregate at the same level as the route-aggregate that contained the congestion. For example, if the replacement is being done at the tile level, FIG. 9 will return the closest uninvestigated other tile within the same LEAF. Conversely, if the replacement is being done at the LEAF level, FIG. 9 will return the closest uninvestigated LEAF within a BLOCK. How the closest uninvestigated child is determined, will be discussed below with respect to FIG. 9.

After returning from FIG. 9, block 704 determines whether a uninvestigated child was available. If so, block 704 transfers to block 708 which determines whether the child returned from FIG. 9 already has its output assigned. If so, block 708 transfers back to block 702 to get a new child since the best possible replacement would be another route-aggregate that has not yet had its output assigned.

If the output of the child has not been assigned, block 708 transfers to block 710 which determines whether the child is exchangeable with the route-aggregate causing the congestion. The child will be exchangeable if the route-aggregate causing the congestion has not already been placed in the location occupied by the child route-aggregate. If, however, the route-aggregate causing the congestion has already been placed in the child's location at some time in the past, it would be useless to place it there again since it will not solve the congestion problem. Thus, if the child is not exchangeable, block 710 transfers back to block 702 to get the next child.

If the child is exchangeable, block 710 transfers to block 712 which determines whether the route-aggregate causing the congestion has had any of its outputs already assigned. If the route-aggregate is a PALE, this could not happen since the lack of an assignment of the output caused the initial congestion. If, however, the route-aggregate has moved up to a LEAF, BLOCK, or SECTOR, some outputs within the LEAF, BLOCK, or SECTOR may have already been assigned.

If the route-aggregate has had some outputs previously assigned, block 712 transfers to block 716 which frees resources from those assignments, and then block 718 sets the status to REPLACED_START_OVER, thus, triggering the "rip up" discussed above with respect to block 418. If the route-aggregate has not had any outputs assigned previously, block 712 transfers to block 714 which sets the status to REPLACED_CONTINUE, which will not trigger the "rip up" discussed above with respect to block 418. After setting the status, control transfers to block 720 which exchanges the route-aggregate and the child and then block 722 marks the route-aggregate and location as already been exchanged, so that this route-aggregate will not be placed in this same location in some future attempt at replacement. FIG. 7 then returns to FIG. 6.

In the manner just described, FIG. 7 attempts to exchange the route-aggregate that caused the congestion with another route-aggregate that has no outputs already assigned, since this would be the best replacement. If the system is unable to locate a child with no outputs already assigned, block 704 will transfer to block 706 which calls FIG. 8 to replace the route-aggregate with a child that has already had some previous output assignments, since there is no other alternative.

Figure 8:
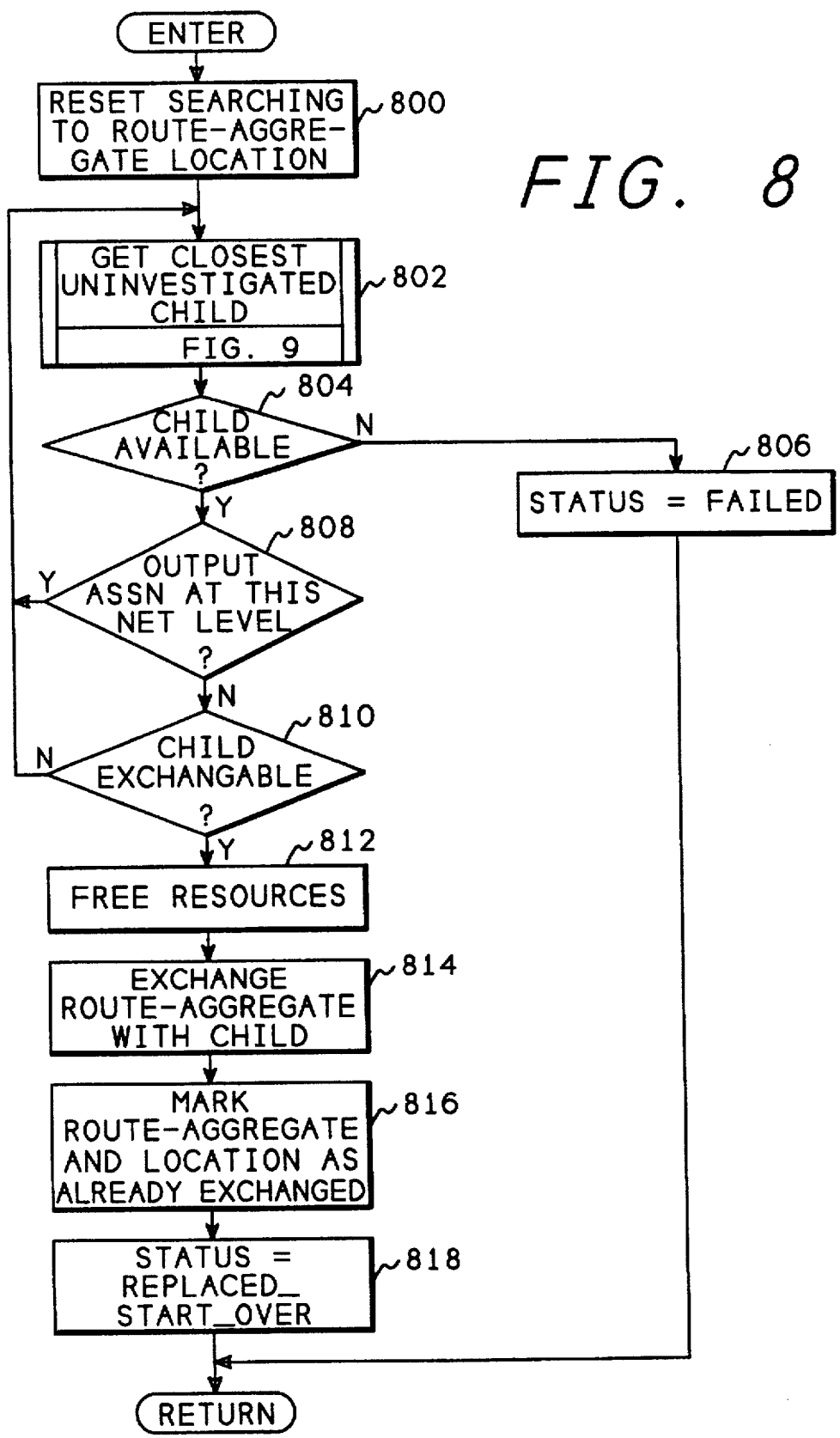

FIG. 8 shows a flowchart of the REPLACE WITH CHILD HAVING OUTPUT ASSIGNMENT process called from block 706 of FIG. 7. Referring now to FIG. 8, after entry, block 800 resets the searching to the same route-aggregate location to which the searching was initialized in block 700, so that the same child route-aggregates can be checked again. Block 802 then calls FIG. 9 to get the closest uninvestigated child, and block 804 determines whether a child is available. If no child is available, block 804 goes to block 806 which sets the status to FAILED and returns.

Block 808 determines whether the child already has an output assigned at the same wire level as the net that caused the congestion, and if so, this child route-aggregate is not a candidate for replacement so block 808 transfers back to block 802 to get the next child. If the child already has an assignment at the same wire level, exchanging it with the route-aggregate would accomplish nothing, since there would still be congestion at the same wire level.

If the child does not have an assignment at this level, block 808 goes to block 810 which determines whether the child is exchangeable, that is, whether this child and the route-aggregate have been exchanged previously. If the child is not exchangeable, block 810 goes back to block 802 to get the next child, however, if the child is exchangeable, block 810 goes to block 812 which frees the resources of the child and resources of the route-aggregate being exchanged, if any had been used. Block 814 then exchanges the route-aggregate with the child obtained from FIG. 9, and block 816 marks the route-aggregate and the child location as already having been exchanged so that they are not placed again in this location in a future exchange attempt. Block 818 then sets the status to REPLACED_START_OVER, which triggers the "rip up" as discussed above with respect to block 418. FIG. 8 then returns to FIG. 7.

FIG. 9 shows a flowchart of the get closest uninvestigated child called from either block 702 of FIG. 7 or block 802 of FIG. 8. Referring now to FIG. 9, after entry, block 902 determines whether the searching is in the smaller or larger direction. The direction of searching is set initially by FIG. 12 which was called from block 700 of FIG. 7, and will be changed as discussed below. The smaller direction is toward the closest edge of the parent route-aggregate, and the larger direction is toward the edge of the parent route-aggregate that is farthest away from the route-aggregate that caused the congestion. For example, if tile one within a LEAF caused the congestion, tile 0 would be in the smaller direction, and tiles 2 and 3 would be in the larger direction.

Figure 10:
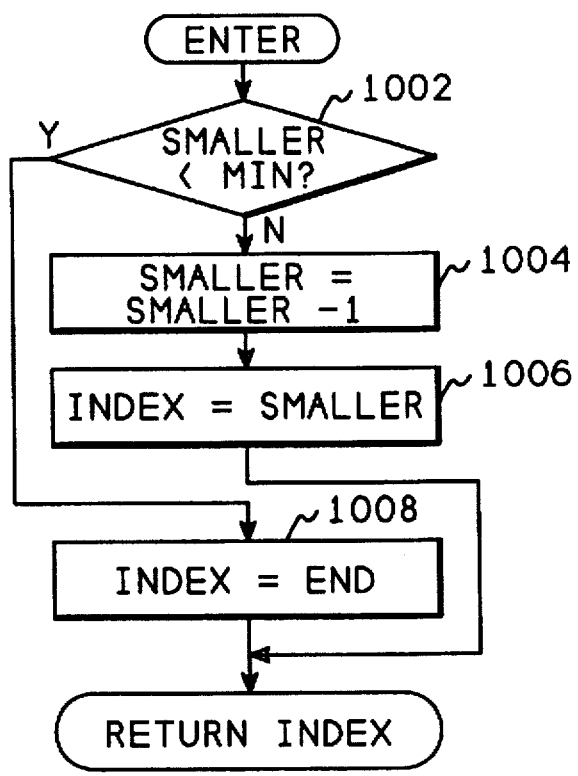

If the searching is in the smaller direction, block 902 transfers to block 904 which calls FIG. 9 to get the smaller index. That is, the index of the next child in the smaller direction. After returning from FIG. 10, block 906 sets the direction to search in the larger direction for the next search and block 908 determines whether the index obtained from FIG. 10 is the end of the child list. If the index is the end of the list, block 908 transfers to block 910 which calls FIG. 11 to get the larger index. That is, if the system is attempting to search in the smaller direction, but all possibilities in that direction have been exhausted, the system must continue searching in the larger direction. After obtaining the larger index, or if the index obtained from FIG. 10 was not the end of the list, control transfers to block 912 which returns the child, identified by the index obtained, to the caller, either FIG. 7 or FIG. 8.

Figure 11:
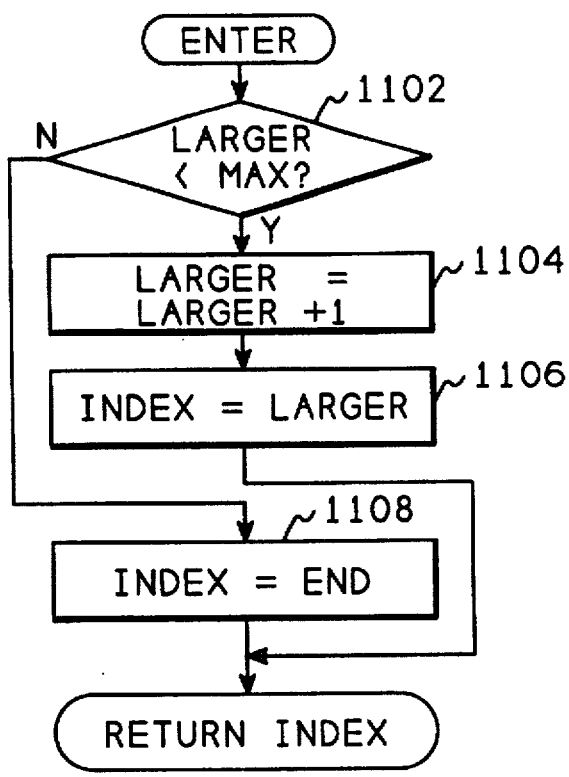

If the searching was not in the smaller direction, block 902 transfers to block 914 which calls FIG. 11 to get the next larger index and then block 916 sets the direction of the next search to search in the smaller direction. Block 918 then determines whether the index obtained in block 914 is the end of the list, and if so, transfers to block 920 to get the next smaller index. That is, if the system is attempting to search in the larger direction, but the list is exhausted, the system then continues searching in the smaller direction. After obtaining the next smaller index, or if the larger index was not the end, control transfers to block 912 which returns the child referenced by the index.

FIG. 10 shows a flowchart of the get next smaller index process called from block 904 or block 920 of FIG. 9. Referring now to FIG. 10, after entry, block 1002 determines whether the smaller index value is less than the minimum index value, as set by the initialized searching process of FIG. 12 called from block 700 of FIG. 7. If smaller is less than min, block 1002 transfers to block 1008 which sets the index to the end of the list value and then returns.

If smaller is not less than min, block 1002 transfers to block 1004 which subtracts one from the smaller index value and then block 1006 sets the index to the value of the smaller variable, and returns to FIG. 9.

FIG. 11 shows a flowchart of the get next larger index called from block 910 or block 914 of FIG. 9. Referring now to FIG. 11, after entry, block 1102 determines whether the larger index variable is less than the maximum as set by the process of FIG. 12 called from block 700 of FIG. 7. If larger is not less than the maximum value, block 1102 transfers to block 1108 which sets the index value to the end of the list before returning. If larger is less than the maximum value, block 1102 transfers to block 1104 which increments the larger variable by one and then block 1106 sets the index to the value of the larger variable before returning to FIG. 9.

Figure 12:
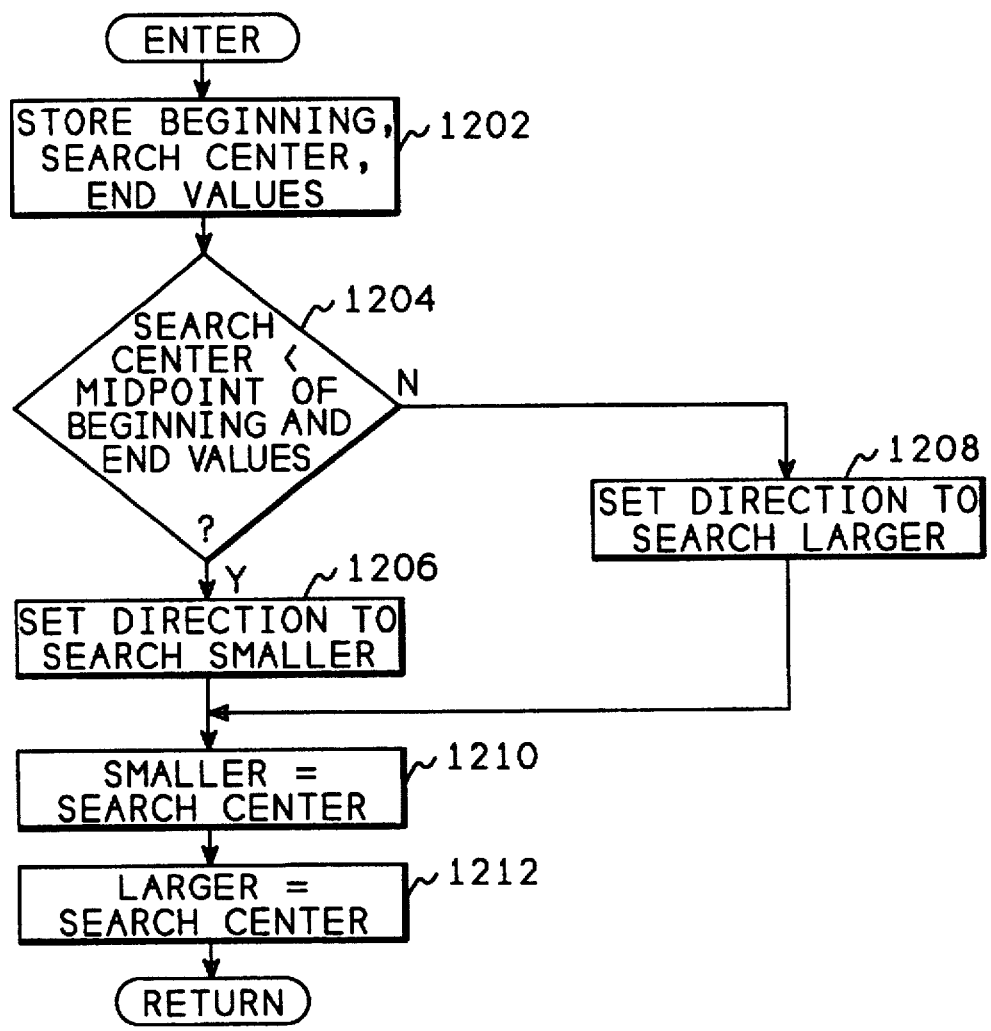

FIG. 12 shows a flowchart of the initialize searching process called from block 700 of FIG. 7. Referring now to FIG. 12, after entry, block 1202 stores the beginning and end values of the indexes to be searched, as well as the center value, which is the starting route-aggregate for the search. Block 1204 then determines whether the search center is less than the midpoint of the beginning and end values. That is, block 1204 determines whether the search center starting value is toward the smaller, i.e. smaller index values, or larger, i.e. larger index values, end of the route-aggregate to be searched. If the search center is toward the smaller end, block 1204 transfers to block 1206 which sets the initial search direction toward the smaller end. If the search center is not less than the midpoint, block 1204 transfers to block 1208 which sets the initial direction of searching toward the larger end of the parent route-aggregate.

This causes the initial searching for a route-aggregate for replacement to be closer to the outside edge of the parent route-aggregate, thus, forcing most replacements to stay toward the outside of the parent route-aggregates.

After setting the initial search direction, control goes to block 1210 which sets the value of the smaller variable to the search center value, and then block 1212 sets the value of the larger variable to the search center value before returning to FIG. 7.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the scope of the present invention as defined in the claims. The disclosures and the description herein are intended to be illustrative and are not in any sense limiting of the invention, defined in scope by the following claims.

What is claimed is:

1. A method for allocating connecting signals and placing circuits within areas of an integrated circuit, said method comprising the steps of:
   (a) retrieving a net that defines a connection between at least two circuits;
   (b) examining at least one of a plurality of connecting signals available to establish said connection defined by said net, and allocating a free one of said connecting signals;
   (c) when no free connecting signal is available for establishing said connection, exchanging said circuit with another circuit within said integrated circuit, said exchanging comprising the step of:
      (c1) successively examining nearest neighbors of said circuit to locate a nearest neighbor circuit having no output connecting signal already allocated, and when a nearest neighbor is found having no output connecting signal already allocated, exchanging said circuit with said nearest neighbor circuit having no output connecting signal already allocated (c2) when no nearest neighbor is found that has no output connecting signal allocated, successively examining nearest neighbors of said circuit to locate a nearest neighbor circuit having no output connecting signal to a location a same distance as a location of a connecting signal of said circuit, and when a nearest neighbor is found having no output connecting signal to a farther location, exchanging said circuit with said nearest neighbor circuit having no output connecting signal to a farther location; and (d) repeating steps (a) through (c) until all nets for said integrated circuit have been processed.

2. The method of claim 1 wherein said successively examining of step (c1) further comprise the following steps (c1a) through (c1c) and said successively examining of step (c1a) further comprises the following steps (c2a) through (c2c):

(c1a) examining a nearest neighbor circuit on a first side of said circuit;

(c1b) if said nearest neighbor circuit selected in step (c1a) has an output connecting signal already allocated, selecting a nearest neighbor circuit on a side opposite said first side;

(c1c) repeating steps (c1a) through (c1b) with each successively nearest neighbor until a nearest neighbor circuit having no output connecting signal allocated is found or all nearest neighbor circuits have been examined;

(c2) examining a nearest neighbor circuit on a first side of said circuit;

(c2b) if said nearest neighbor circuit selected in step (c1a) has no output connecting signal to a location a same distance as a location of a connecting signal of said circuit, selecting a nearest neighbor circuit on a side opposite said first side; and (c2c) repeating steps (c2a) through (c2b)) with each successively nearest neighbor until a nearest neighbor circuit having no output connecting signal to a location a same distance as a location of a connecting signal of said circuit is found or all nearest neighbor circuits have been examined.

3. The method of claim 2 wherein said successively examining of steps (c1a) and step (c2a) further comprises:

successively examining all nearest neighbor circuits within a predefined area of a first size within said integrated circuit before examining nearest neighbor circuits in a predefined area of a next larger size.

4. The method of claim 2 wherein said first side is defined to be a side having a fewest number of circuits between said circuit and an edge of a predefined area of said integrated circuit.

5. The method of claim 1 wherein said net retrieved in step (a) is for a hyperlink connecting signal.

6. A method for allocating connecting signals and placing circuits within areas of an integrated circuit, said method comprising the steps of:

(a) retrieving a net that defines a connection between at least two circuits;

(b) examining at least one of a plurality of connecting signals available to establish said connection defined by said net, and allocating a free one of said connecting signals;

(c) when no free connecting signal is available for establishing said connection, exchanging said circuit with another circuit within said integrated circuit, said exchanging comprising the steps of:

(c1) successively examining nearest neighbors of said circuit to locate a nearest neighbor circuit having no output connecting signal already allocated, and when a nearest neighbor is found having no output connecting signal already allocated, exchanging said circuit with said nearest neighbor circuit having no output connecting signal already allocated, (c2) when no nearest neighbor is found that has no output connecting signal allocated, successively examining nearest neighbors of said circuit to locate a nearest neighbor circuit having no output connecting signal to a location a same distance as a location of a connecting signal of said circuit, and when a nearest neighbor is found having no output connecting signal to a farther location, exchanging said circuit with said nearest neighbor circuit having no output connecting signal to a farther location; and (d) repeating steps (a) through (c) until all nets for said integrated circuit have been processed.

7. The method of claim 6 wherein said successively examining of step (c1) further comprise the following steps (c1a) through (c1c) and said successively examining of step (c2) further comprises the following steps (c2a) through (c2c):

(c1a) examining a nearest neighbor circuit on a first side of said circuit;

(c1b) if said nearest neighbor circuit selected in step (c1a) has an output connecting signal already allocated, selecting a nearest neighbor circuit on a side opposite said first side;

(c1c) repeating steps (c1a) through (c1b) with each successively nearest neighbor until a nearest neighbor circuit having no output connecting signal allocated is found or all nearest neighbor circuits have been examined;

(c2a) examining a nearest neighbor circuit on a first side of said circuit;

(c2b) if said nearest neighbor circuit selected in step (c1a) has no output connecting signal to a location a same distance as a location of a connecting signal of said circuit, selecting a nearest neighbor circuit on a side opposite said first side; and (c2c) repeating steps (c2a) through (c2b)) with each successively nearest neighbor until a nearest neighbor circuit having no output connecting signal to a location a same distance as a location of a connecting signal of said circuit is found or all nearest neighbor circuits have been examined.

8. The method of claim 7 wherein said successively examining of steps (c1a) and step (c2a) further comprises:

successively examining all nearest neighbor circuits within a predefined area of a first size within said integrated circuit before examining nearest neighbor circuits in a predefined area of a next larger size.

9. The method of claim 8 wherein said first side is defined to be a side having a fewest number of circuits between said circuit and an edge of a predefined area of said integrated circuit.

10. The method of claim 6 wherein said net retrieved in step (a) is for a hyperlink connecting signal.

11. A method for allocating connecting signals and placing circuits within areas of an integrated circuit, wherein said areas comprise a hierarchy of smaller areas within larger areas and wherein connecting signals between sets of comparably sized areas comprises a hierarchy of levels of connecting signals, said method for placing comprising the steps of:

(a) retrieving a net that defines a connection between at least two circuits;

(b) examining at least one of a plurality of connecting signals available to establish said connection defined by said net, and allocating a free one of said connecting signals;

(c) when no free connecting signal is available for establishing said connection, exchanging said circuit with another circuit within said integrated circuit, said exchanging comprising the steps of:

(c1) successively examining nearest neighbors of said circuit to locate a nearest neighbor circuit having no output connecting signal already allocated, and when a nearest neighbor is found having no output connecting signal already allocated, exchanging said circuit with said nearest neighbor circuit having no output connection already allocated (c2) when no nearest neighbor is found that has no output connecting signal allocated, successively examining nearest neighbors of said circuit to locate a nearest neighbor circuit having no output connecting signal allocated at a higher level of a connecting signal of said circuit, and when a nearest neighbor is found having no output connecting signal at a higher level, exchanging said circuit with said nearest neighbor circuit having no output connecting signal at a higher level; and (d) repeating steps (a) through (c) until all nets for said integrated circuit have been processed.

12. The method of claim 11 wherein said successively examining of step (c1) further comprise the following steps (c1a) through (c1c) and said successively examining of step (c2) further comprises the following steps (c2a) through (c2c):

(c1a) examining a nearest neighbor circuit on a first side of said circuit;

(c1b) if said nearest neighbor circuit selected in step (c1a) has an output connecting signal already allocated, selecting a nearest neighbor circuit on a side opposite said first side;

(c1c) repeating steps (c1a) through (c1b)) with each successively nearest neighbor until a nearest neighbor circuit having no output connecting signal is found or all nearest neighbor circuits have been examined;

(c2a) examining a nearest neighbor circuit on a first side of said circuit;

(c2b) if said nearest neighbor circuit selected in step (c1a) has no output connecting signal to a location a same distance as a location of a connecting signal of said circuit, selecting a nearest neighbor circuit on a side opposite said first side; and (c2c) repeating steps (c2a) through (c2b)) with each successively nearest neighbor until a nearest neighbor circuit having no output connecting signal to a location a same distance as a location of a connecting signal of said circuit is found or all nearest neighbor circuits have been examined.

13. The method of claim 12 wherein said successively examining of steps (c1a) and step (c2a) further comprises:

successively examining all nearest neighbor circuits within an area of a first size before examining nearest neighbor circuits in an area of a next larger size.

14. The method of claim 12 wherein said first side is defined to be a side having a fewest number of circuits between said circuit and an edge of an area containing said circuit.

15. The method of claim 11 wherein said net retrieved in step (a) is for a hyperlink connecting signal.

16. The method of claim 11 wherein said exchanging always causes all circuits at one level of said hierarchy of areas to be exchanged with all circuits at a same level of said hierarchy of areas.

* * * * *